US010117360B2

(12) United States Patent
Crawford

(10) Patent No.: US 10,117,360 B2
(45) Date of Patent: Oct. 30, 2018

(54) OUT-OF-BAND DATA CENTER MANAGEMENT VIA POWER BUS

(71) Applicant: Vapor IO Inc., Austin, TX (US)

(72) Inventor: Colton Malone Crawford, Austin, TX (US)

(73) Assignee: Vapor IO Inc., Austin, TX (US)

( * ) Notice: Subject to any disclaimer, the term of this patent is extended or adjusted under 35 U.S.C. 154(b) by 125 days.

(21) Appl. No.: 15/065,212

(22) Filed: Mar. 9, 2016

(65) Prior Publication Data
US 2016/0266632 A1 Sep. 15, 2016

Related U.S. Application Data

(60) Provisional application No. 62/130,018, filed on Mar. 9, 2015, provisional application No. 62/248,788, filed on Oct. 30, 2015, provisional application No. 62/275,909, filed on Jan. 7, 2016.

(51) Int. Cl.
| | |
|---|---|
| *G06F 1/28* | (2006.01) |
| *H05K 7/14* | (2006.01) |
| *H05K 7/20* | (2006.01) |
| *G06F 1/30* | (2006.01) |

(52) U.S. Cl.
CPC ......... *H05K 7/20736* (2013.01); *G06F 1/305* (2013.01); *H05K 7/1492* (2013.01); *H05K 7/1497* (2013.01); *H05K 7/20145* (2013.01); *H05K 7/20745* (2013.01); *H05K 7/20836* (2013.01); *G06F 1/28* (2013.01)

(58) Field of Classification Search
None
See application file for complete search history.

(56) References Cited

U.S. PATENT DOCUMENTS

| | | |
|---|---|---|
| 5,063,475 A | 11/1991 | Balan |
| 6,133,526 A | 10/2000 | Lebo et al. |
| 7,133,289 B2 | 11/2006 | Arippol |
| (Continued) | | |

OTHER PUBLICATIONS

International Search Report & Written Opinion for Related Application PCT/US2016/021515, dated Jun. 17, 2016, pp. 1 to 13.
(Continued)

*Primary Examiner* — Kim Huynh
*Assistant Examiner* — Danny Chan
(74) *Attorney, Agent, or Firm* — Pillsbury Winthrop Shaw Pittman LLP

(57) ABSTRACT

Provided is a process including: receiving, with a given rack computing unit, direct current (DC) power via a DC bus connected to a plurality of rack computing units of a rack and configured to deliver DC power to the plurality of rack computing units; determining that a duration of time designated for the given rack computing unit to access the DC power bus for transmission is occurring; in response to the determination, applying a time-varying electrical stimulus to the DC power bus, wherein the time-varying electrical stimulus encodes an address on the DC power bus of a rack controller and a sensor measurement indicative of operation of the given rack computing unit; and concurrent with applying the time-varying electrical stimulus, filtering voltage fluctuations of the DC power bus resulting from the time-varying electrical stimulus to produce electrical power used by the given rack computing unit.

17 Claims, 8 Drawing Sheets

(56) References Cited

U.S. PATENT DOCUMENTS

| | | | |
|---|---|---|---|
| 7,426,110 B2 | 9/2008 | Malone et al. | |
| 7,508,663 B2 | 3/2009 | Coglitore | |
| 7,573,715 B2 | 8/2009 | Mojaver et al. | |
| 7,688,593 B2 | 3/2010 | Byers et al. | |
| 7,697,305 B2 | 4/2010 | Meyer et al. | |
| 7,907,402 B2 | 3/2011 | Caveney | |
| 8,198,998 B1* | 6/2012 | Propp | H02J 13/0024 340/538 |
| 8,297,067 B2 | 10/2012 | Keisling et al. | |
| 8,320,125 B1 | 11/2012 | Hamburgen et al. | |
| 8,867,204 B1 | 10/2014 | Gardner | |
| 9,001,456 B2 | 4/2015 | Campbell et al. | |
| 2002/0098792 A1 | 7/2002 | Hsiao | |
| 2002/0149911 A1 | 10/2002 | Bishop et al. | |
| 2003/0031449 A1 | 2/2003 | Simmons et al. | |
| 2004/0132398 A1 | 7/2004 | Sharp et al. | |
| 2005/0201073 A1 | 9/2005 | Pincu et al. | |
| 2006/0209475 A1 | 9/2006 | Cabrera et al. | |
| 2006/0215363 A1 | 9/2006 | Shipley et al. | |
| 2007/0019613 A1* | 1/2007 | Frezzolini | H04B 3/542 370/352 |
| 2007/0064383 A1 | 3/2007 | Tanaka et al. | |
| 2008/0151497 A1 | 6/2008 | Lai et al. | |
| 2009/0024764 A1 | 1/2009 | Atherton et al. | |
| 2009/0251860 A1 | 10/2009 | Belady et al. | |
| 2009/0308579 A1 | 12/2009 | Johnson et al. | |
| 2010/0034297 A1* | 2/2010 | Takasu | H04B 3/54 375/257 |
| 2010/0102937 A1* | 4/2010 | Swenson | H04B 3/54 340/538 |
| 2010/0151781 A1 | 6/2010 | Slessman et al. | |
| 2010/0317278 A1 | 12/2010 | Novick | |
| 2011/0116226 A1 | 5/2011 | Yang | |
| 2011/0014862 A1 | 8/2011 | Honold et al. | |
| 2011/0317971 A1 | 12/2011 | Zhang et al. | |
| 2012/0016290 A1 | 1/2012 | Shin | |
| 2012/0103843 A1 | 5/2012 | Wei | |
| 2012/0111817 A1 | 5/2012 | Sweeny et al. | |
| 2012/0128507 A1 | 5/2012 | Scheidler | |
| 2012/0134096 A1 | 5/2012 | Zhang | |
| 2012/0166693 A1 | 6/2012 | Weinstock et al. | |
| 2012/0275084 A1* | 11/2012 | Familiant | H04B 3/54 361/601 |
| 2013/0107450 A1 | 5/2013 | Zhang et al. | |
| 2013/0120931 A1 | 5/2013 | Sankar et al. | |
| 2013/0133350 A1 | 5/2013 | Reytblat | |
| 2013/0205069 A1 | 8/2013 | Delfatti et al. | |
| 2013/0301649 A1* | 11/2013 | Vijayasankar | H04L 12/413 370/445 |
| 2014/0113539 A1 | 5/2014 | Dickinson et al. | |
| 2014/0137491 A1 | 5/2014 | Somani et al. | |
| 2014/0177163 A1 | 6/2014 | Wiley | |
| 2014/0185225 A1 | 7/2014 | Wineland | |
| 2014/0268528 A1 | 9/2014 | Mick | |
| 2014/0297855 A1 | 10/2014 | Moore et al. | |
| 2015/0090679 A1 | 4/2015 | Obernesser et al. | |
| 2015/0129514 A1 | 5/2015 | Bourdoncle et al. | |
| 2015/0256386 A1* | 9/2015 | Palmer | F24F 11/006 709/220 |
| 2015/0289405 A1 | 10/2015 | Stewart et al. | |
| 2015/0381237 A1* | 12/2015 | Griffith | H04B 3/546 375/258 |
| 2016/0043873 A1* | 2/2016 | Wendt | H04B 3/548 307/1 |
| 2016/0107312 A1 | 4/2016 | Morrill et al. | |

OTHER PUBLICATIONS

International Search Report & Written Opinion or Related Application PCT/US2016/021521, dated Jun. 20, 2016, pp. 1 to 13.

'Wireless data centers could be faster, cheaper, greener', http://www.news.cornell.edu/stories/2012/09/wireless-data-centers-could-be-faster-cheaper-greener, Sep. 26, 2012, pp. 1 to 2.

'Wild New Design: Data Center in a Silo', http://www.datacenterknowledge.com/archives/2009/12/10/wild-new-design-data-center-in-a-silo/, Dec. 10, 2009, pp. 1 to 6.

'Calcul gets creative with data center cooling design', http://searchdatacenter.techtarget.com/photostory/2240169084/New-book-takes-you-inside-unique-energy-efficient-data-centers/3/Calcul-gets-creative-with-data-center-cooling-design, Oct. 23, 2012, pp. 1 to 3.

Non-Final Office Action for Related U.S. Appl. No. 15/065,201, dated Aug. 12, 2016, pp. 1 to 18.

Non-Final Office Action for Related U.S. Appl. No. 15/065,181, dated Jul. 22, 2016, pp. 1 to 25.

Non-Final Office Action for Related U.S. Appl. No. 15/165,590, dated Aug. 30, 2016, pp. 1 to 24.

International Search Report & Written Opinion for Related PCT Application PCT/US2016/034328, dated Aug. 24, 2016, pp. 1 to 12.

\* cited by examiner

OUT-OF-BAND DATA CENTER MANAGEMENT VIA POWER BUS

CROSS-REFERENCE TO RELATED APPLICATIONS

The present application claims the benefit of the following U.S. Provisional Patent Applications: U.S. 62/130,018, filed 9 Mar. 2015; U.S. 62/248,788, filed 30 Oct. 2015; and U.S. 62/275,909, filed 7 Jan. 2016. The entire content of each parent application is incorporated by reference in its entirety.

BACKGROUND

1. Field

The present invention relates generally to computing equipment and, more specifically to out-of-band management networks for data centers.

2. Description of the Related Art

Data centers are often used to house and interconnect large collections of computing devices, like servers, databases, load balancers, and high-performance computing clusters. Often, the computing devices are interconnected with two different networks: an in-band network for conveying the data upon which the computing devices operate, for example content in webpages, queries and query responses, and data for high-performance computing; and an out-of-band management network for conveying commands to the individual computing devices to manage their operation and for conveying information like sensor data indicative of the operation of the computing devices.

Out-of-band management serves a number of purposes, depending on the use case. Examples of out-of-band activity include remote serial console sessions for server management. Often, out-of-band management networks are used to manage security risk, by limiting the attack surface of a network that could be used to control the computing devices and segregating the in-band network that often receives data from the outside world. In some cases, out-of-band management networks are operative to control the computing devices even when the computing devices are turned off, for example, by accessing memory on computing devices that is persistent (like flash memory) to perform things like BIOS (e.g., UEFI) updates, read values, and the like. Other examples of activities include booting a device that is been turned off, remote installation of operating systems, updates, setting hardware clock speeds, updating or querying firmware versions, and the like.

In many cases, the terminal portion of the out-of-band network is made via RS-232 buses. In many cases, this requires expensive serial concentrators in the rack to deal with many separate connections. Generally, the RS-232 specification is meant for a point-to-point connectivity between devices and, in many cases, does not provide for multiple concurrent transmitting devices on a single bus. This often limits the use of specification-compliant buses and increases wiring costs.

SUMMARY

The following is a non-exhaustive listing of some aspects of the present techniques. These and other aspects are described in the following disclosure.

Some aspects include a process including: receiving, with a given rack computing unit, direct current (DC) power via a DC bus connected to a plurality of rack computing units of a rack and configured to deliver DC power to the plurality of rack computing units; determining that a duration of time designated for the given rack computing unit to access the DC power bus for transmission is occurring; in response to the determination, applying a time-varying electrical stimulus to the DC power bus, wherein the time-varying electrical stimulus encodes an address on the DC power bus of a rack controller and a sensor measurement indicative of operation of the given rack computing unit; and concurrent with applying the time-varying electrical stimulus, filtering voltage fluctuations of the DC power bus resulting from the time-varying electrical stimulus to produce electrical power used by the given rack computing unit.

BRIEF DESCRIPTION OF THE DRAWINGS

The above-mentioned aspects and other aspects of the present techniques will be better understood when the present application is read in view of the following figures in which like numbers indicate similar or identical elements.

Figure 1:
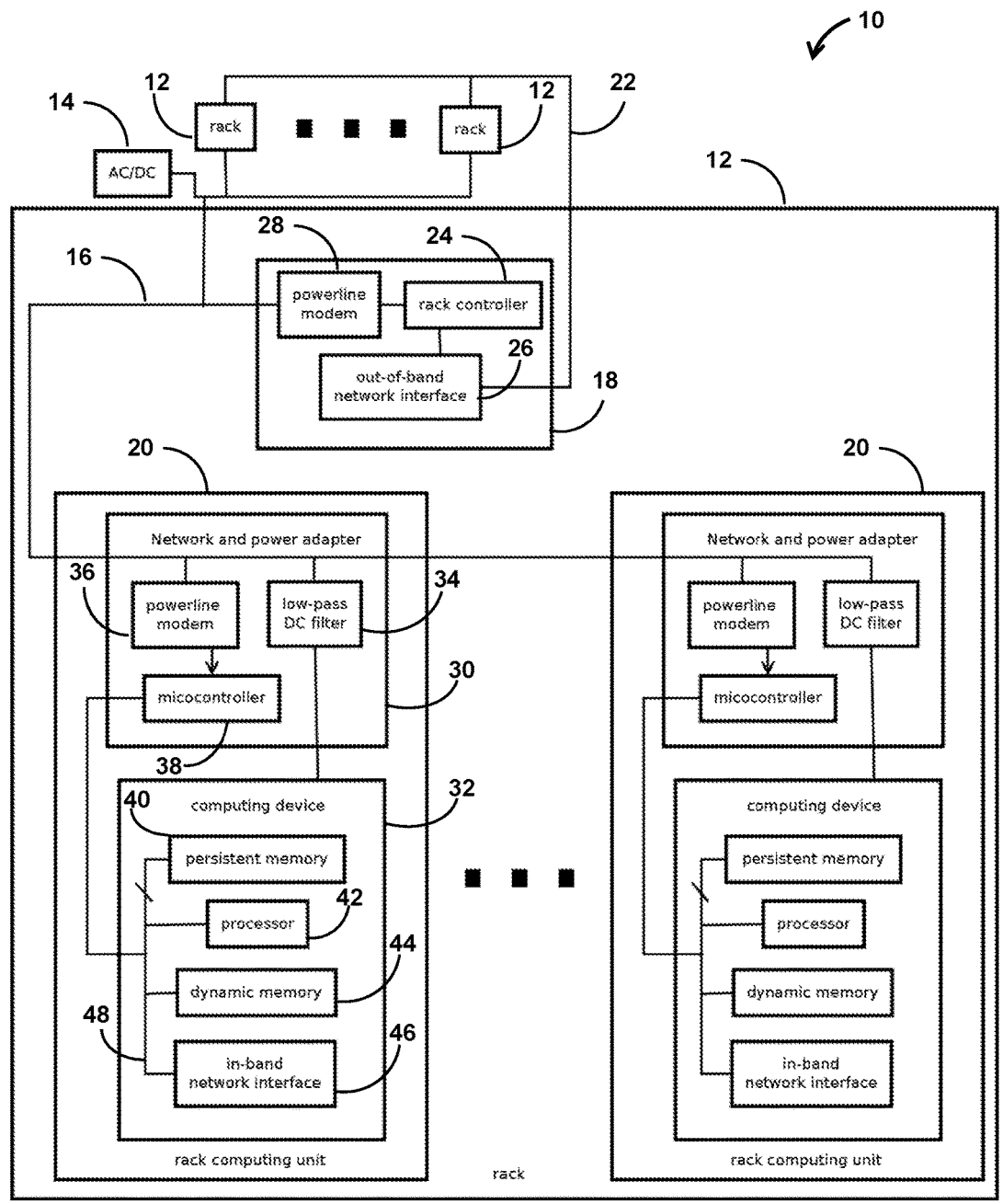
FIG. 1 illustrates a data center configured for out-of-band management via power bus, in accordance with some embodiments.

While the invention is susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF CERTAIN EMBODIMENTS

To mitigate the problems described herein, the inventors had to both invent solutions and, in some cases just as importantly, recognize problems overlooked (or not yet foreseen) by others in the field of data center design. Indeed, the inventors wish to emphasize the difficulty of recognizing those problems that are nascent and will become much more apparent in the future should trends in the data center industry continue as applicants expect. Further, because multiple problems are addressed, it should be understood that some embodiments are problem-specific, and not all embodiments address every problem with traditional systems described herein or provide every benefit described herein. That said, improvements that solve various permutations of these problems are described below.

As noted above, traditional out-of-band networks present a number of problems in data center designs. These problems are often co-occur with other undesirable aspects of data center hardware worth noting. Additional issues include added cost for power distribution and conditioning circuitry. In many cases, power is distributed within a data center via alternating current, while individual computing devices generally operate on direct current. In many cases, the transition between alternating current and direct current is made with computing device specific AC-to-DC power converters. This architecture has the undesirable effect of multiplying the number of power converters within a data center, placing a heat source and electromagnetic radiation source near sensitive computing equipment, occupying valuable rack space, and multiplying the number of locations were failures may occur in hardware. (These discussions of problems with traditional design should not be taken as disclaimers of subject matter, as several inventions are described, and they are independently useful and may be used in environments where some problems persist while others are addressed.)

FIG. 1 illustrates a data center 10 configured to mitigate some, and in some cases all, of the above problems. In some embodiments, the data center 10 includes a plurality of racks, examples of which are described below with reference to FIGS. 3-7, housing a plurality of computing devices, an example of which is described below with reference to FIG. 8. In some embodiments, the data center 10 includes a relatively large number of racks 12, for example, more than 10, or more than 20, and each rack may house a relatively large number of computing devices, for example, more than 10, and in many cases more than 50.

In some embodiments, an alternating current-to-direct current converter 14 may deliver direct current to each of the racks 12 via a bus 16 that also conveys data. In some embodiments, each rack 12 may include its own converter 14 that services a collection of computing devices on the rack, or in some cases several racks 12 may share a converter 14. In some embodiments, converter 14 includes a rectifier, step down transformer, and low-pass filter operative to deliver, for example to racks 12, direct current power. Rack-specific converters are expected to segment the media for out-of-band data signaling, reduce the number of users of the address space on the media, and permit simplified and less expensive circuitry for the devices communicating on the DC power bus, but embodiments are also consistent with busses shared across racks.

In some embodiments, direct-current power is distributed via a direct current power bus 16. In some cases, the direct-current power bus 16 includes two distinct conductors, for example, carrying ground and a 12 volt potential. In some embodiments, each rack 12 may include the DC bus 16, or a dedicated DC bus 16 specific to that rack, for example, to maintain and address space within a rack that is distinct from that of other racks and simplify signaling protocols and reduce cost of associated circuitry.

In the illustrated embodiment, racks 12 each include a rack control unit 18 and a plurality of rack computing units 20. Two units 20 are illustrated, but embodiments are consistent with substantially more, for example, on the order of 40 or more per rack. In some embodiments, the rack control unit 18 may exercise local control and monitoring over the operation of computing devices in the rack 12 (and perform operations distinct from a network switch that routs in-band data), and each rack 12 may include its own independent rack control unit 18. In some embodiments, the rack control unit 18 may operate as gateways between an Ethernet out of band network 22 and a DC power bus network 16, for example specific to each rack 12. In some embodiments, the out of band Ethernet network 22 may connect each of the racks 12 via their rack control unit 18, and the data center may be managed via network 22, with monitoring data being sent back to a central monitoring station via network 22 and commands being distributed via network 22 for implementation by controllers 18.

In some embodiments, remote terminal sessions, for example, may be maintained between the administrator's computer connected to network 22 and individual rack computing units 20 via networks 22 and 16. In some embodiments, rack control units 18 may monitor the operation and presence of rack computing units 20 and, in some cases, components of those rack computing units 20, via the powerline communication bus 16. In some embodiments, the rack control unit 18 may be configured to periodically poll existing devices on the network 16 and report back via network 22 the result of the poll. In some cases, rack control units 18 may periodically request, from each rack computing unit 20 via the DC power bus 16, the status of various sensors, such as temperature sensors, vibration sensors, particulate sensors, fan speed sensors, airflow sensors, humidity sensors, air pressure sensors, noise sensors, and the like. In some embodiments, rack control unit 18 may compare the reported values to a threshold and raise or log various alarms, for example, via network 22, to bring a condition to the attention of an administrator. Similarly, in some cases, rack control unit 18 may implement various changes on rack computing units 20 by a command set via network 16. Examples include instructing rack computing units to boot up or turn off, update a bios, change a setting in persistent flash memory (in some cases bypassing the bios), update or report a firmware version, change a register value in a peripheral, and initiating and executing a remote terminal session. In some embodiments, rack computing unit 18 and network 16 are operative to exercise control over the rack computing units 20 even when the computing devices, such as servers of those rack computing units are turned off. This is expected to reduce the cost of maintenance personnel, as certain operations can be performed remotely, even in scenarios in which the computing devices are turned off.

In some embodiments, rack computing units 20 each occupy a respective shelf or a receptacle, such as a "U," in the rack. In some embodiments, each rack computing unit includes a distinct computer, having a dedicated processor and memory that operates to execute an operating system and application within a distinct memory address space. Any number of applications may be executed, including web servers, databases, simulations, and the like, in some cases in virtualized computing devices. In some embodiments, the applications may communicate with one another and remote users via an in-band network that conveys the data the computing devices operates upon, which stands in contrast to the management data by which the computing devices are managed and monitored.

In the illustrated embodiment, rack control unit 18 includes a rack controller 24, and out-of-band network interface 26, and a powerline modem 28. In some embodiments, the rack controller 24 may implement the logical functions described above, for example, for monitoring the rack computing units, controlling the rack computing units, and translating between the networks 16 and 22. In some embodiments, the rack controller 24 may execute routines that control, engage, and disengage various thermal control units, such as fans or adjustable airflow restrictors, that maintain the temperature of the rack computing units 20, for example, responsive to temperature sensors on the units 20 indicating an imbalance in airflow or positive pressure in an exhaust region. In some embodiments, the rack controller 24 is an application executing on a distinct computing device having a processor, memory, and an operating system. In some embodiments, the rack controller 24 includes a REST-based web server interface operative to receive instructions and provide responses on the network 22 according to a RESTful application program interface (API).

In some embodiments, the out-of-band network interface 26 is an Ethernet network interface having an associated driver executing in the operating system of the rack controller 24. In some cases, the out-of-band network interface 26 connects to an Ethernet cable, such as a CAT5 (category 5), or CAT6 (category 6) cable connecting to the other racks 12.

In some embodiments, the various devices on the DC power bus 16, including the rack control unit 18, include a powerline modem 28. In some embodiments, the powerline modem 28 is a direct current powerline modem operative to encode data on top of a direct current power source. (Signals readily separated from the DC power, e.g., at higher than a threshold frequency or less than a threshold root-mean-square deviation for the median, do not transform the DC power to AC power.) In some embodiments, the data is transmitted by applying an electrical stimulus to the electrical conductors conveying direct current power. The stimulus may take any of a number of different forms. Examples include selectively connecting a higher or lower voltage to the conductors, thereby pulling the voltage up or down in a manner that may be sensed by other powerline modems. Other examples include selectively connecting a current source or drain to the conductors of the DC power bus 16, thereby again imparting an electrical signal on top of the DC power that may be sensed by other computing devices. In some embodiments, an impedance may be selectively coupled to the DC power bus, thereby, for example, affecting fluctuations imposed on top of the DC power bus in a manner that may be sensed by other powerline modems.

In some embodiments, the electrical stimulus is a time varying electrical stimulus. Data may be encoded by varying the electrical stimulus a number of different ways. In some embodiments, the stimulus may simply be turned on and off according to a clock signal, like with a square wave, and data may be conveyed by determining during each clock cycle whether the stimulus is applied or not, indicating a zero or one. In other examples, the stimulus may be used to adjust an attribute of a wave, like a carrier wave, maintained on the DC power bus. For example, data may be encoded with pulse width modulation, by applying a square wave to the DC power bus and adjusting the time of a falling edge of the square wave according to whether a zero or one is being transmitted. Other examples may adjust a rising edge of the square wave or a duty cycle of the square wave or other waveforms. In some embodiments, multiple attributes may be adjusted, for example varying in amplitude of the wave, a duty cycle of the wave, and times for falling or rising edges of the wave to encode additional data in a more compact form.

In some embodiments, at the same time data is being conveyed on the DC power bus, DC power is also being conveyed. In some embodiments, the data signals may be configured such that they do not interfere with the delivery of DC power. For example, the time varying electrical stimulus may change the DC voltage or current by less than a threshold percentage of what is delivered, for example with a RMS value less than 10% of the median, such that filtering can readily remove the data signal from electrical power being delivered to computing devices that are often sensitive to variations in electrical power. In other embodiments, the speed with which the data is conveyed, or a carrier wave, may be at a frequency such that low-pass filters can readily distinguish between the DC power component and the data component.

In some embodiments, to facilitate separation of data from power, the data may be encoded with pulse width modulation, such that data-dependent effects are less likely to interfere with power delivery. For example, absent a carrier wave, a relatively long string of one's or zeros that are consecutive may cause power to fluctuate on the downstream side of a low-pass filter, resulting in low-frequency increases or decreases in voltage of the DC powerline that may penetrate a low-pass filter. In contrast, pulse width modulation maintains a relatively uniform average voltage after a low-pass filter is applied, as the frequency of the pulses that are modulated may be selected such that they are readily separated from the underlying DC power signal.

In some embodiments, access to the DC power bus as a medium for data transmission may be arbitrated with a variety of techniques. Examples include time division multiplexing, code division multiplexing, frequency division multiplexing, orthogonal frequency-division multiplexing, and the like. In some implementations, it is expected that the bandwidth requirements for the network 16 will be very low (e.g., less than 100 kilobits per second), and an encoding scheme may be selected to reduce the cost of the associated circuitry. For example, in some implementations, the speed and cost of Ethernet connections may be excessive relative to the requirements for signaling. In contrast, relatively low bandwidth time division multiplexing circuitry on a synchronous network is expected to cost substantially less while still providing adequate bandwidth. This is not to suggest that embodiments are inconsistent with higher bandwidth architectures. It should be noted that many in the industry have persistently failed to recognize this opportunity for cost reduction and circuitry simplification.

In some embodiments, each powerline modem 28 may select a duration of time over some cycle in which that powerline modem on the network 16 is permitted to transmit, e.g., in the event that the powerline modem does not detect that another device on the network currently has control of the media. In some embodiments, a device has control of the media if it has received a request on the network 16 and has not yet responded. In some embodiments, the network may be a synchronous network. In some embodiments, the duration of time dedicated for each powerline modem on the network 16 to transmit when the media is unclaimed may be selected based on a factory set value, like a media access (MAC) address, initially.

In some embodiments, an ad hoc mechanism may be used to deal with collisions, in which multiple devices have selected the same duration of time. In some embodiments, the powerline modem 28 may be operative to detect when another device is transmitting at the same time, and in response, select a different duration of time, for example, randomly (like pseudo-randomly or by seeding a linear shift register with less significant digits of a reading from a temperature sensor). For instance, powerline modem 28 may have reserved as its time to transmit between zero and 100 milliseconds (ms) after some timing signal, while a powerline modem of a first rack control unit may have reserved as its time to transmit 100 ms to 200 ms, and a different rack computing unit may have as its time to transmit 300 ms to 400 ms. Collisions occur when two devices select the same duration of time, and a randomized re-selection may alleviate the conflict without a central authority allocating time slots. Selecting transmission durations in an ad hoc fashion is expected to substantially lower the cost of maintenance and simplify installation, as devices can be installed on the network 16 without additional configuration, in some embodiments. That said, not all embodiments provide this benefit, as several inventions are described that are independently useful.

In some embodiments, the modem 28 may encode data and commands in a particular format, for example, in packets having headers with an address of the receiving and transmitting devices. In some embodiments, each powerline modem on the network 16 may receive signals and determine whether the signal includes a packet having a header designated for that device. In some embodiments, the packets may include error correction and detection, for example, with parity bits, Hamming codes, or other redundant lower entropy encoding.

A variety of techniques may be used to receive signals. For example, some embodiments may apply the signal on the DC power bus 16 to a low-pass filter and then compare the filtered signal to the signal on the DC power bus 16 to determine a differential signal having, for example, a higher frequency component conveying data. In some cases, the differential may be compared to a threshold to determine whether a zero or one is being transmitted. Or a pulse-width modulated signal may be compared to an unmodulated signal of the same underlying frequency, and changes in edge timing may produce a signal that, when compared to a threshold, indicates a zero or one.

In some embodiments, the signals may correspond to those traditionally used in RS232 connections to facilitate re-use of existing hardware and software. Examples include the Data Terminal Ready signal, indicating that data terminal equipment (DTE) is ready to receive, initiate, or continue a call; the Data Carrier Detect signal, indicating a data circuit-terminating equipment (DCE) is receiving a carrier from a remote DCE; Data Set Ready, indicating that DCE is ready to receive commands or data; Request to Send, indicating that a DTE requests the DCE prepare to transmit data; Request to Receive, indicating that a DTE is ready to receive data from a DCE; Transmitted Data, carrying data from the DTE to DCE; and Received Data, carrying data from the DCE to the DTE.

In some embodiments, communication may be via request and response, where once a request is sent by one device on the network 16, the recipient device has the exclusive right to transmit on the network 16 until a response is sent. Or some embodiments may use a master-slave architecture, where, for example, the powerline modem 28 of the rack control unit 18 arbitrates which device communicates on the network 16 when. Request and response synchronous architectures, however, are expected to allow for relatively simple and inexpensive circuitry, which may be favorable in some implementations.

As illustrated, in some embodiments, each rack computing unit 20 may include a network and power adapter 30 and a computing device 32. In some embodiments, the network and power adapter 30 may separate DC power and data from the DC power bus 16, provide the power to the computing device 32, and process the data to implement various routines locally with logic that is independent of the computing device 32 and operates even when the computing device 32 is turned off.

In the illustrated embodiment, the network and power adapter 30 includes a low-pass filter 34, a powerline modem 36, and a microcontroller 38. In some embodiments, these components 34, 36, and 38 may be mounted to a printed circuit board that is distinct from a motherboard of the computing device 32 and couples, for example, via a cable, to the motherboard of the device 32. In some embodiments, the low-pass filter 34 may be operative to receive the DC power from the DC power bus 16, having the data signals overlaid there on, and remove the data signals to transmit a smooth, high quality DC power source to the computing device 32. A variety of techniques may be used to implement the low-past DC filter 34. In some embodiments, an inductor may be placed in series between the bus 16 and the computing device 32 to provide a relatively large impedance therebetween and reduce the power required to drive data signals onto the bus 16 and protect associated driver circuitry. In other embodiments, the low-past DC filter 34 may also include a resistor placed in series between the bus 16 in the device 32, with a capacitor placed between a ground and high voltage signal of the bus to, again, provide an impedance to reduce the power requirements to drive data signals, while smoothing fluctuations.

In some embodiments, the powerline modem 36 is substantially similar to the powerline modem 28 described above and may implement the same protocols. In some embodiments, each rack computing unit 20 contains similar or the same features.

In some embodiments, the microcontroller 38 is operative to receive signals from the powerline modem 36 and take responsive action. In some embodiments, the microcontroller 38 monitors addresses in headers on packets received via the powerline modem 36 and determines whether the address corresponds to the rack computing unit 20. In some embodiments, the address is stored in persistent flash memory of the microcontroller 38, for example, in flash memory set with a serial number or MAC address set at the factory. In some embodiments, upon initially detecting that the network and power adapter 30 is connected to a DC power bus 16, the microcontroller 38 may broadcast is address to the other devices, for example, to add the address to a list of addresses maintained by the rack control unit 18 as received via the powerline modem 28.

In some embodiments, the microcontroller 38 may receive commands from the rack control unit 18 and implement those commands, for example, by querying or otherwise polling various sensors, like those described above, to monitor things like resources being used by the rack computing unit 20 (e.g. processor usage or memory usage), or environmental conditions, like temperature, vibrations, airflow, particulates, humidity, electromagnetic radiation, and the like. In some embodiments, the microcontroller 38 may be operative to drive various signals into the computing device 32 that reconfigure the computing device 32, monitor the computing device 32, or control the computing device 32. Examples include sending signals onto a system management bus or other bus of the computing device 32 that cause the computing device 32 to turn on, turn off, change a setting accessible via a BIOS (in some cases without engaging the BIOS and writing directly to flash memory), reconfiguring various settings, like clock speed or register settings for peripheral devices. In some embodiments, the microcontroller 38 is operative to poll various sensors that indicate the location of the rack computing unit 20, for example, by reading a value with an optical sensor or a radio frequency sensor disposed on a rack that indicates the location of a rack computing unit 20 adjacent that device.

In some embodiments, the computing device 32 is a server (e.g., a computer executing a server application), database, or node in a compute cluster that performs operations requested by users of the data center 10. Examples include serving webpages, servicing queries, processing API requests, performing simulations, and the like. Such computing operations are distinct from those performed to manage and control the operation of computing devices 32, for example, by changing versions of operating systems, updating or reconfiguring a BIOS, reading sensors, controlling fans, monitoring thermals, and the like.

In the illustrated embodiment, each computing device 32 includes persistent memory 40, a processor 42, dynamic memory 44, and an in-band network interface 46. In some embodiments, these components may be accessed by the microcontroller 38 via a system management bus 48 or various other onboard buses. In some embodiments, the components 40, 42, 44, and 46 may reside on a single monolithic motherboard, connected via soldered connections and conductive traces in a printed circuit board. In some embodiments, the persistent memory 40 is flash memory having various values by which the computing device 32 is configured, for example, by changing settings in a BIOS. In some embodiments, the processor 42 is one or more central processing units or graphics processing units. In some embodiments, the dynamic memory 44 contains memory used by the operating system and applications, in some cases having an address space distinct from the computing devices of other rack computing units.

In some embodiments, the in-band network interface 46 is an Ethernet network interface operable to communicate on a distinct Ethernet network from the network 22. Separating these networks is expected to make the data center 10 more robust to attacks and facilitate operations even when the in-band network is disabled. Further, in some cases, the in-band network may be substantially higher bandwidth and use more expensive equipment than the out-of-band management network 22. In some embodiments, the network connected to interface 46 may convey the data upon which the applications operate, for example, at the request of users of the data center 10.

Figure 2:
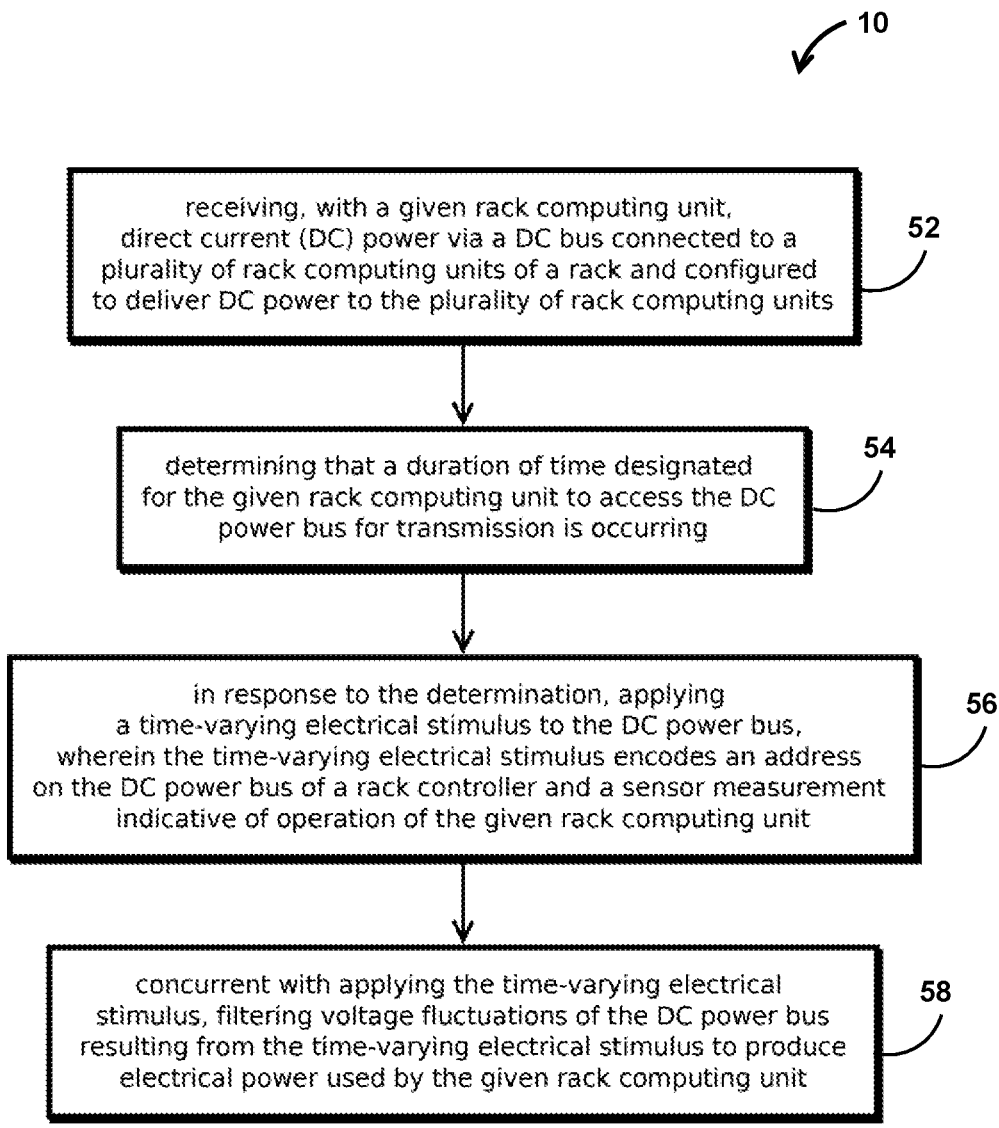
FIG. 2 illustrates an example of a process for out-of-band management of data center of FIG. 1, in accordance with some embodiments.

FIG. 2 illustrates an example of a process 50 that may be performed by some embodiments of the above-described network and power adapter 30 in rack computing units 20. In some embodiments, steps for performing the process 50, or the other functionality described herein, are encoded as instructions on a tangible, non-transitory, machine-readable media, such that when the instructions are read and executed by one or more processors, the associated functionality occurs.

In some embodiments, the process 50 includes receiving, with a given rack computing unit, direct current power via a DC bus connected to a plurality of rack computing units of a rack and configured to deliver DC power to the plurality of rack computing units, as indicated by block 52.

In some embodiments, the process 50 further includes determining that a duration of time designated for the given rack computing unit to access the DC power bus for transmission is occurring, as indicated by block 54. Next, in response to the determination, some embodiments may apply a time-varying electrical stimulus to the DC power bus, as indicated by block 56. In some cases, the time-varying electrical stimulus encodes an address on the DC power bus of a rack controller and a sensor measurement indicative of operation of the given rack computing unit. In other cases, the stimulus may encode control signals rather than data signals. Next, concurrent with applying the time-varying electrical stimulus, some embodiments include filtering voltage fluctuations of the DC power bus resulting from the time-varying electrical stimulus to produce electric power used by the given rack computing unit, as indicated by block 58. Producing electrical power does not require that the power be generated, merely that power obtained from some source be conditioned properly for usage by the rack computing unit.

Figure 3:
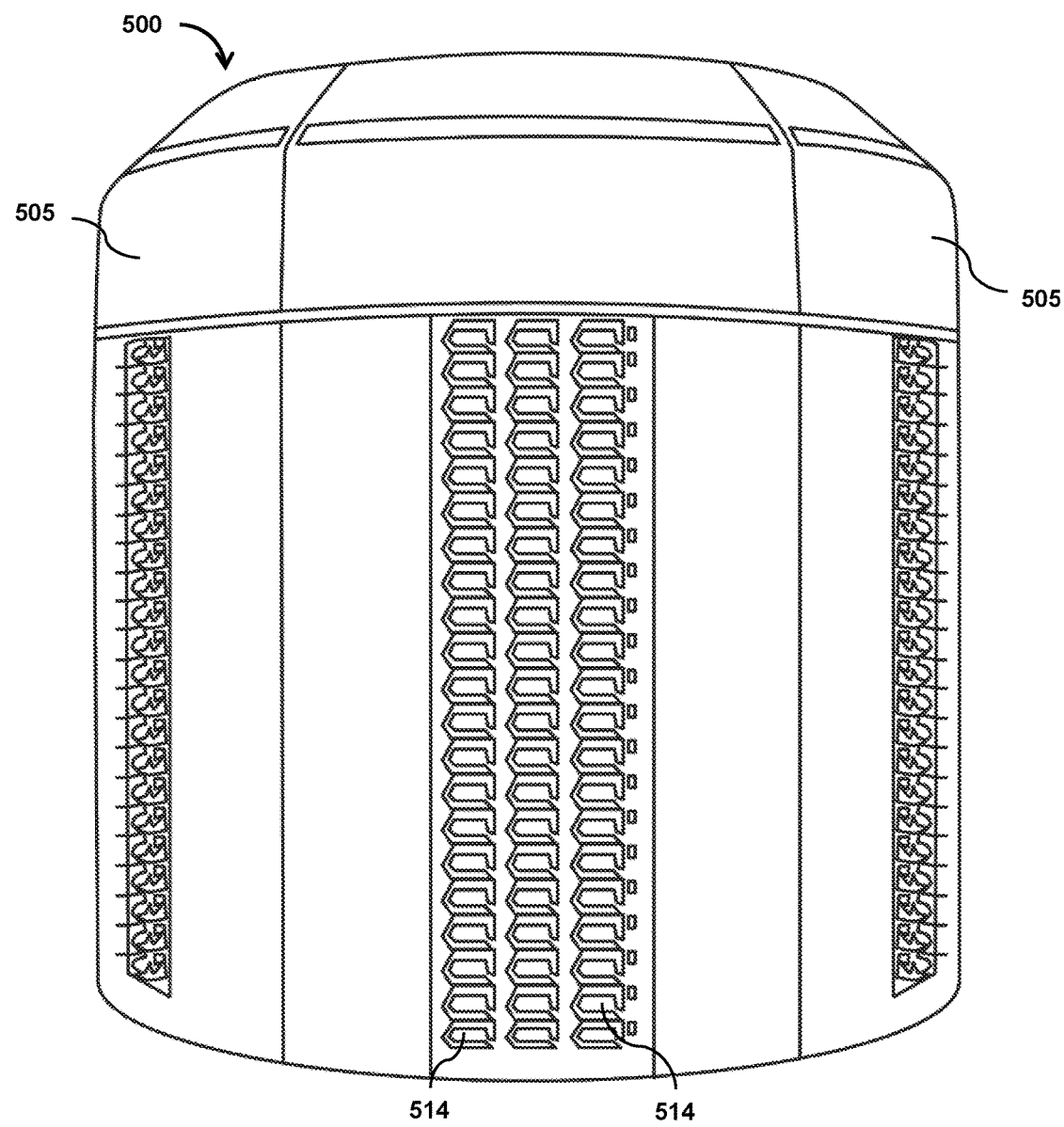
FIG. 3 illustrates an example of a data center chamber, in accordance with some embodiments.

FIG. 3 shows an example of a rack chamber 500 in which the above-described techniques may be implemented. The illustrated rack chamber includes multiple wedge racks 505 that afford various benefits that are independently useful from those described above. It should be noted that the techniques described above may also be applied in more conventional arrangements of rack computing devices, for example in more traditional architectures with linear rows of rack-mounted computing devices position on either side of a hot aisle.

Chamber 500 includes a plurality of racks 505 configured to hold arrays of rack-mounted computing devices 514. Racks 505 are arranged non-linearly (e.g., in a rotationally symmetric array) to define chamber 500 and the interior chamber. Racks 505, in some embodiments, are "wedge racks" shaped to define the interior chamber when placed adjacent one another, for instance, by forming a wedge-shape in their horizontal cross section. In some embodiments, wedge racks 505 may be arranged into a shape such as a triangle, square, hexagon, or octagon with the back sides all facing towards (and in some cases partially or entirely defining) the interior chamber. In some embodiments, the chamber 500 may have a generally cylindrical shape, e.g., a circular cylindrical shape. In some embodiments, the chamber 500 may be generally rotationally symmetric about a vertical axis extending through the center of the chamber 500. In some embodiments, the interior chamber of datacenter chamber 500 may generally be of cylindrical shape. In some cases, the interior chamber of datacenter chamber 500 may define (e.g., approximate) a right cylinder with a base having a variety of shapes consistent with the present techniques, e.g., a rectangular, triangular, pentagonal, hexagonal, heptagonal, octagonal, decagonal, dodecagonal, or elliptical. In some cases, the interior chamber may define a tapered shape, such as an inverted cone, in which the diameter of the bottom is larger than the top or vice versa.

In some embodiments, chamber 500 provides front side rack access (the outer perimeter of the chamber) to access three categories of information technology interfaces (e.g., of computing devices 514): compute; network, and storage. In some embodiments, the components by which the computing devices are connected to power and one another may be accessible from the exterior of the chamber, e.g., the inner column may be generally or fully devoid of such connections, or alternate connections may be accessible from the exterior. (Or some embodiments may include such connections in the interior.)

In some cases, the datacenter chamber 500 may house more than 50 U's of computing devices 514 and may span more than 5 feet in diameter (e.g., approximately 9 feet). Further, in some cases, the racks in the chamber may be approximately the height of a person, e.g., on the order of six feet tall to facilitate access by technicians (e.g., five feet or higher). In some embodiments, one or more datacenter chambers may be part of a modular data center that can be placed where data capacity is needed. This may allow for rapid deployment, energy efficiency, high-density computing, and cost reduction (though embodiments are also consistent with a non-modular design).

Figure 4:
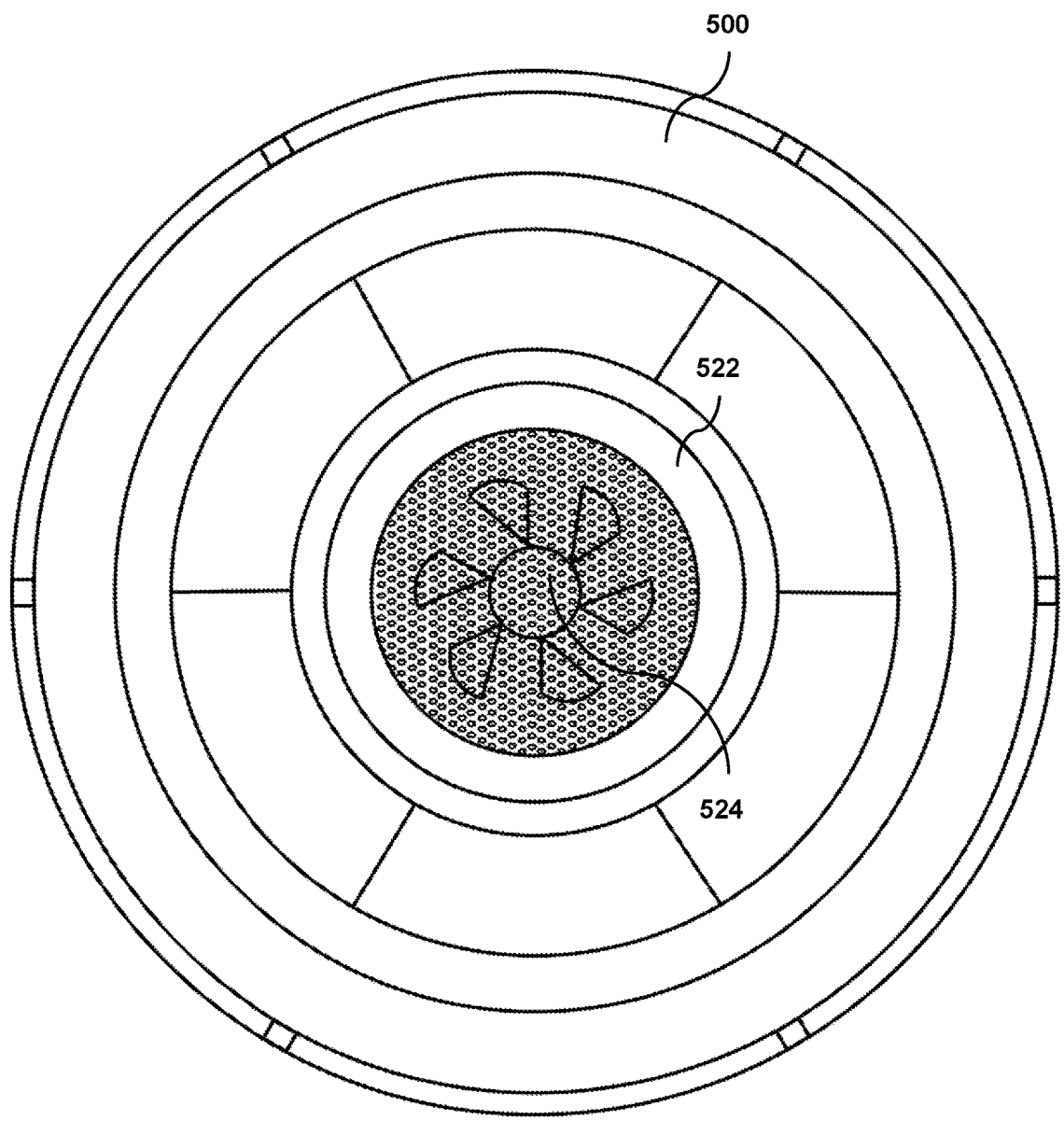
FIG. 4 illustrates an example operation of the chamber of FIG. 3, in accordance with some embodiments.

FIG. 4 illustrates operation of the chamber of FIG. 3, in accordance with some embodiments. Cold air may be pulled or pushed from all directions of chamber 500, drawn to the inner chamber and exits through an exhaust output 522 in the top of chamber 500. (Or the flow may be reversed.) In some embodiments, a fan 524 in FIG. 4, or an array of fans may be arranged and positioned in the top of the lid and configured to pull the hot air upward. In some cases, the fan may be configured to pull the hot air into ductwork that routes the air elsewhere.

Figure 5:
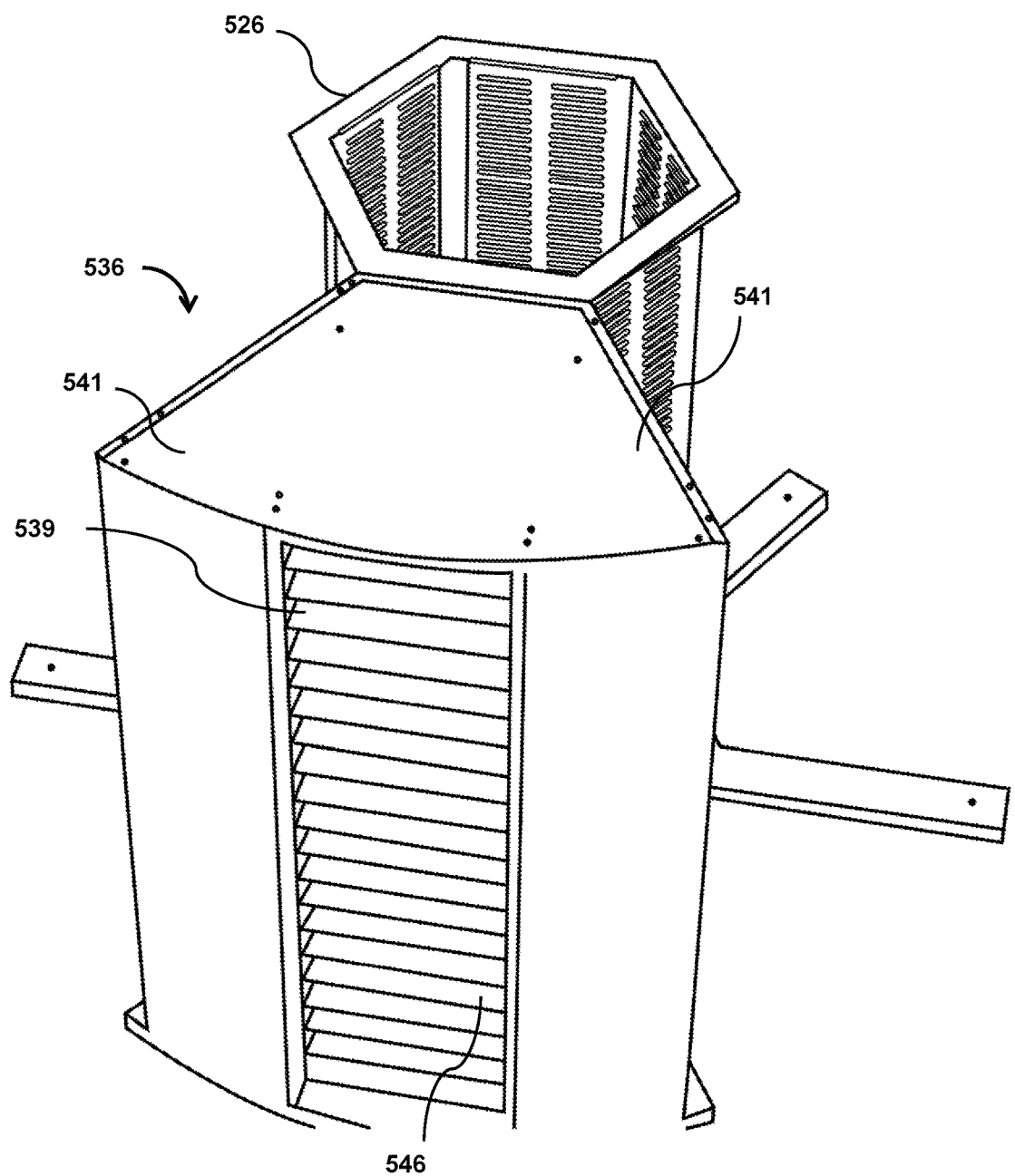
FIG. 5 illustrates an example of components of the chamber of FIG. 3, in accordance with some embodiments.

FIG. 5 illustrates an example of a wedge rack 536 positioned on chassis 526. In this example, wedge rack 536 defines a generally wedge-shaped volume 541 along at least one side of the wedge rack. In some embodiments, computing devices may be disposed on equipment shelves 546. Panel 539 may provide front-side access (front side being the opposite side of a back side adjacent to the interior chamber) for compute, network, and storage interfaces for computing devices mounted in the racks.

Figure 6:
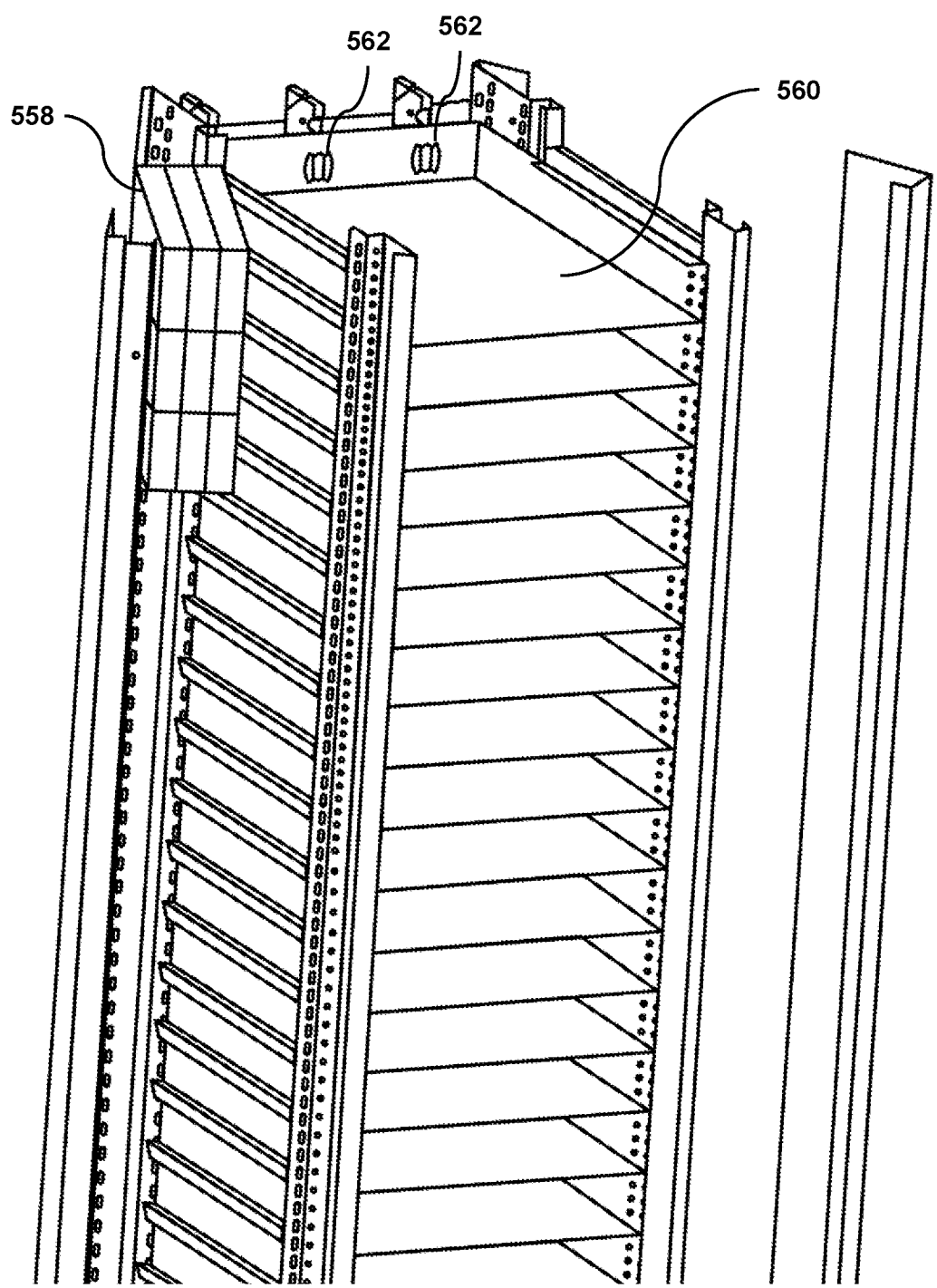
FIG. 6 illustrates an example of components of a rack in the chamber of FIG. 3, in accordance with some embodiments.
Figure 7:
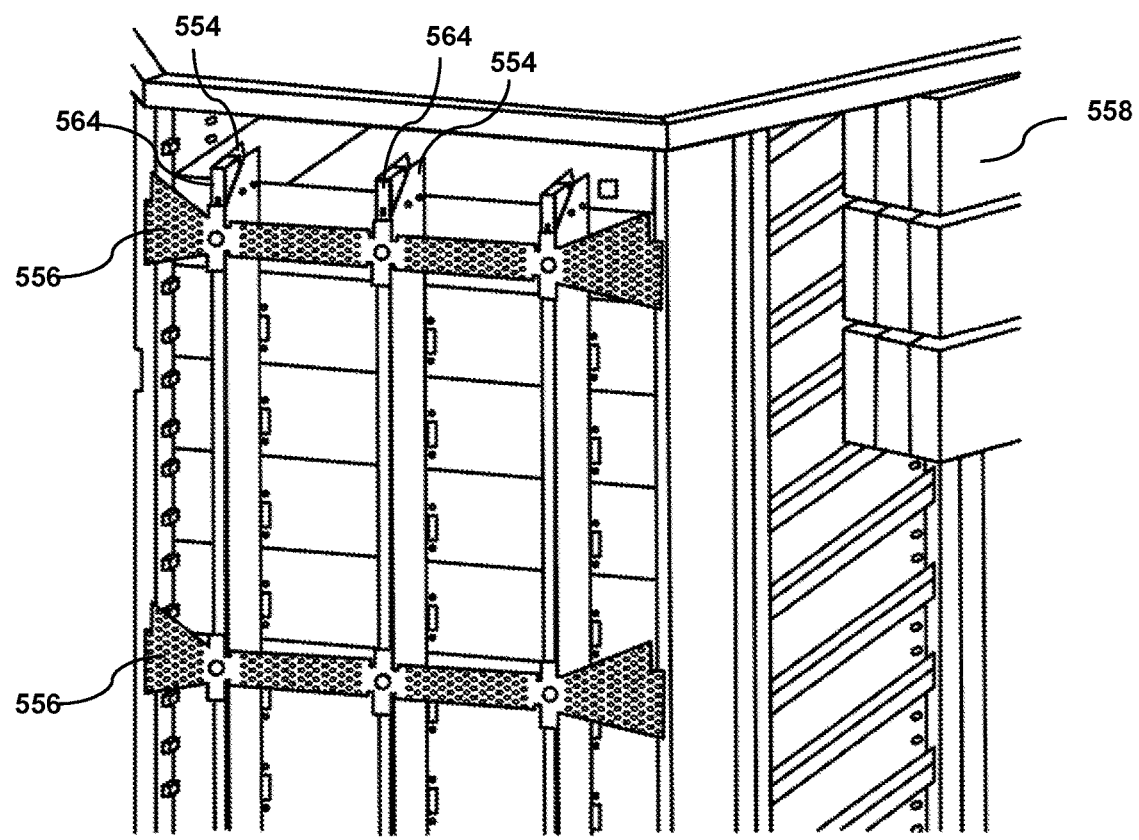
FIG. 7 illustrates an example of components of a rack in the chamber of FIG. 3, in accordance with some embodiments.

FIGS. 6-7 illustrate examples of components of a wedge rack, in accordance with some embodiments. In some embodiments, wedge rack 536 (FIG. 5) includes a plurality of bus bars 554 that may be disposed along the racks adjacent the interior chamber. Bus bar 554 may be connected to bus braces 556 (e.g., via screws). In some embodiments, the bus bars may have insulators 564, or insulation may surround them in some cases to protect them from accidental contact. In some cases bus bars 554 may be enclosed in a metal housing, in the form of bus duct or busway, segregated-phase bus, or isolated-phase bus. In some embodiments, datacenter chamber 500 includes a plurality of computing devices disposed in the racks. The computing devices may be disposed on equipment trays 560. In some cases trays 560 may have a plurality of openings on the back of the trays adjacent the inner chamber. The opening may be configured to facilitate connection of the equipment and bus bars. In some embodiments, the openings may include bus bar connectors (example 562 in FIG. 6).

Connectors 562 are configured to connect to computing equipment as the computing equipment is placed on the tray 560 and slid to the back. In other words, the same action of placing and pushing a computing device in place on the rack connects the computing device to bus bar connector 562 and the DC powerline network described above. In some cases, a bus bar power adaptor may be provided to facilitate the connection between the computing device and bus bar connector 562. In some embodiments, other types of connections may be provided (for example, a wired connection).

In some embodiments bus bars 554 are part of the DC power bus network 16 described above with reference to FIG. 1. Bus bars 554 may be configured to distribute DC power to computing devices that establish electrical contact with the bus bars upon being slid into the rack. The bus bars may be in the form of a metallic strip or bar (e.g., copper, brass or aluminum), and the bus bars may be electrically isolated from the chamber chassis. In some embodiments, the bus bars may be of other shapes (e.g., flat strips, solid bars and rods, solid or hollow tubes, and braided wire). Some of these shapes allow heat to dissipate more efficiently due to their high surface area to cross-sectional area ratio. Hollow or flat shapes are prevalent in higher current applications. In some cases, the one or more bus bars may be enclosed in a bus duct. The material composition and cross-sectional size of the bus bar may determine the maximum amount of current that can be safely carried.

In some embodiments, connectors 562 or the bus bar power adaptor may be similar to network and power adapter 30 described above with reference to FIG. 1. In some embodiments, connectors 562 or the bus bar power adaptor may include similar component having similar functionality as components of network and power adapter 30 (for example, a low-pass filter 34, a powerline modem 36, and a microcontroller 38).

In some embodiments, datacenter chamber 500 may include a backup power supply. In some cases, chamber 500 may include an integrated power infrastructure. For example, an uninterruptable power supply (UPS) which may be configured to provide uninterrupted power over some duration. In some embodiments, the power supply may be a battery-driven power supply (e.g., rectifier or a battery module 558 as shown in FIGS. 6-7). For example, a higher-voltage direct current (DC) power source, such as a battery may provide electrical power that is converted into a lower voltage, higher current DC power source. In some embodiments, the battery may be based on any of a variety of different chemistries. The transformation may be effected by a DC-DC converter, such as a 48-volt to 12-volt DC-DC converter that receives 48 volt DC power at given current and produces 12-volt DC power at a substantially higher current. In some embodiments, the several of the above UPSs may be placed in each rack. In some embodiments, each wedge of a rack may include a separate UPS, e.g., three or more UPSs for each wedge connected in parallel to increase current at a given voltage over that provided by a single UPS. Modular power supplies are expected to limit the scope of damage if any one UPS fails. In some embodiments, the UPS may be controlled remotely.

Figure 8:
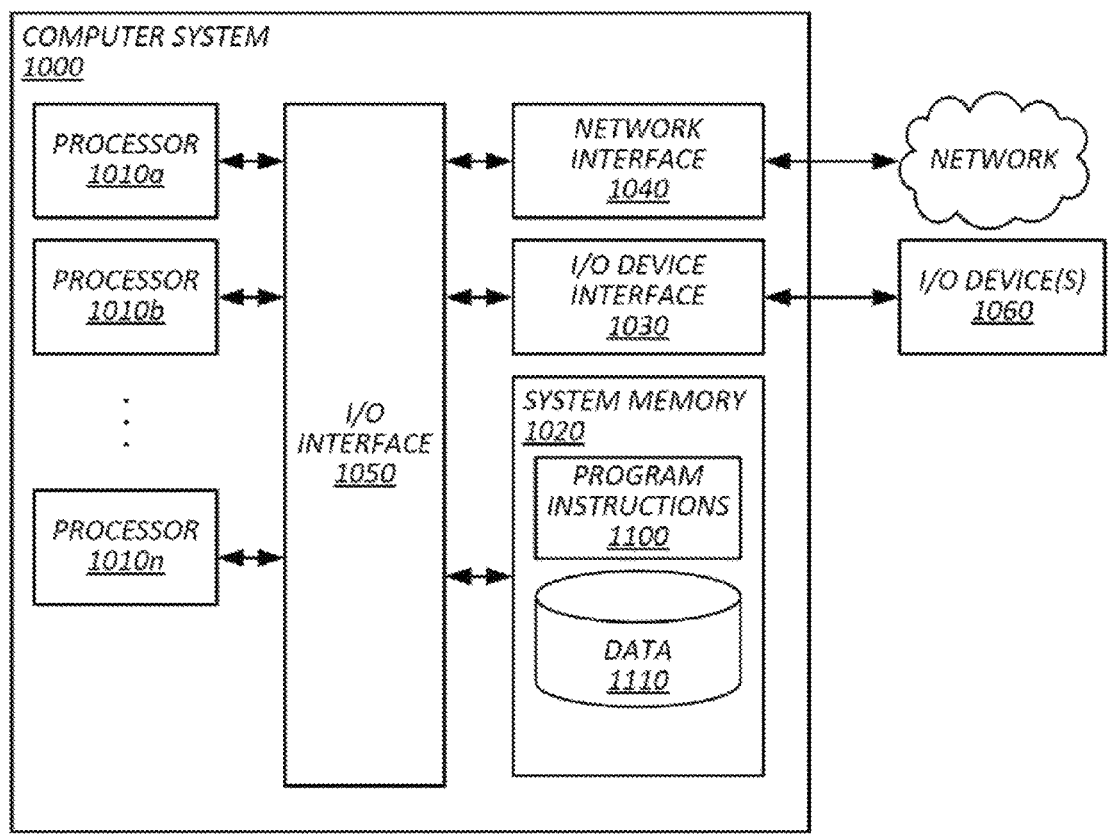
FIG. 8 is a diagram that illustrates an exemplary computing system, in accordance with embodiments of the present techniques.

FIG. 8 is a diagram that illustrates an exemplary computing system 1000 in accordance with embodiments of the present technique. In some cases, each rack of the above-described chamber may house one or more of these systems 1000. Various portions of systems and methods described herein, may include or be executed on one or more computer systems similar to computing system 1000. Further, processes and modules described herein may be executed by one or more processing systems similar to that of computing system 1000.

Computing system 1000 may include one or more processors (e.g., processors 1010a-1010n) coupled to system memory 1020, an input/output I/O device interface 1030, and a network interface 1040 via an input/output (I/O) interface 1050. A processor may include a single processor or a plurality of processors (e.g., distributed processors). A processor may be any suitable processor capable of executing or otherwise performing instructions. A processor may include a central processing unit (CPU) that carries out program instructions to perform the arithmetical, logical, and input/output operations of computing system 1000. A processor may execute code (e.g., processor firmware, a protocol stack, a database management system, an operating system, or a combination thereof) that creates an execution environment for program instructions. A processor may include a programmable processor. A processor may include general or special purpose microprocessors. A processor may receive instructions and data from a memory (e.g., system memory 1020). Computing system 1000 may be a uni-processor system including one processor (e.g., processor 1010a), or a multi-processor system including any number of suitable processors (e.g., 1010a-1010n). Multiple processors may be employed to provide for parallel or sequential execution of one or more portions of the techniques described herein. Processes, such as logic flows, described herein may be performed by one or more programmable processors executing one or more computer programs to perform functions by operating on input data and generating corresponding output. Processes described herein may be performed by, and apparatus can also be implemented as, special purpose logic circuitry, e.g., an FPGA (field programmable gate array) or an ASIC (application specific integrated circuit). Computing system 1000 may include a plurality of computing devices (e.g., distributed computer systems) to implement various processing functions.

I/O device interface 1030 may provide an interface for connection of one or more I/O devices 1060 to computer system 1000. I/O devices may include devices that receive input (e.g., from a user) or output information (e.g., to a user). I/O devices 1060 may include, for example, graphical user interface presented on displays (e.g., a cathode ray tube (CRT) or liquid crystal display (LCD) monitor), pointing devices (e.g., a computer mouse or trackball), keyboards, keypads, touchpads, scanning devices, voice recognition devices, gesture recognition devices, printers, audio speakers, microphones, cameras, or the like. I/O devices 1060 may be connected to computer system 1000 through a wired or wireless connection. I/O devices 1060 may be connected to computer system 1000 from a remote location. I/O devices 1060 located on remote computer system, for example, may be connected to computer system 1000 via a network and network interface 1040.

Network interface 1040 may include a network adapter that provides for connection of computer system 1000 to a network. Network interface may 1040 may facilitate data exchange between computer system 1000 and other devices connected to the network. Network interface 1040 may support wired or wireless communication. The network may include an electronic communication network, such as the Internet, a local area network (LAN), a wide area network (WAN), a cellular communications network, or the like.

System memory 1020 may be configured to store program instructions 1100 or data 1110. Program instructions 1100 may be executable by a processor (e.g., one or more of processors 1010a-1010n) to implement one or more embodiments of the present techniques. Instructions 1100 may include modules of computer program instructions for implementing one or more techniques described herein with regard to various processing modules. Program instructions may include a computer program (which in certain forms is known as a program, software, software application, script, or code). A computer program may be written in a programming language, including compiled or interpreted languages, or declarative or procedural languages. A computer program may include a unit suitable for use in a computing environment, including as a stand-alone program, a module, a component, or a subroutine. A computer program may or may not correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one or more computer processors located locally at one site or distributed across multiple remote sites and interconnected by a communication network.

System memory 1020 may include a tangible program carrier having program instructions stored thereon. A tangible program carrier may include a non-transitory computer readable storage medium. A non-transitory computer readable storage medium may include a machine readable storage device, a machine readable storage substrate, a memory device, or any combination thereof. Non-transitory computer readable storage medium may include non-volatile memory (e.g., flash memory, ROM, PROM, EPROM, EEPROM memory), volatile memory (e.g., random access memory (RAM), static random access memory (SRAM), synchronous dynamic RAM (SDRAM)), bulk storage memory (e.g., CD-ROM or DVD-ROM, hard-drives), or the like. System memory 1020 may include a non-transitory computer readable storage medium that may have program instructions stored thereon that are executable by a computer processor (e.g., one or more of processors 1010a-1010n) to cause the subject matter and the functional operations described herein. A memory (e.g., system memory 1020) may include a single memory device or a plurality of memory devices (e.g., distributed memory devices).

I/O interface 1050 may be configured to coordinate I/O traffic between processors 1010a-1010n, system memory 1020, network interface 1040, I/O devices 1060, or other peripheral devices. I/O interface 1050 may perform protocol, timing, or other data transformations to convert data signals from one component (e.g., system memory 1020) into a format suitable for use by another component (e.g., processors 1010a-1010n). I/O interface 1050 may include support for devices attached through various types of peripheral buses, such as a variant of the Peripheral Component Interconnect (PCI) bus standard or the Universal Serial Bus (USB) standard.

Embodiments of the techniques described herein may be implemented using a single instance of computer system 1000 or multiple computer systems 1000 configured to host different portions or instances of embodiments. Multiple computer systems 1000 may provide for parallel or sequential processing/execution of one or more portions of the techniques described herein.

Those skilled in the art will appreciate that computer system 1000 is merely illustrative and is not intended to limit the scope of the techniques described herein. Computer system 1000 may include any combination of devices or software that may perform or otherwise provide for the performance of the techniques described herein. For example, computer system 1000 may include or be a combination of a cloud-computing system, a data center, a server rack, a server, a virtual server, a desktop computer, a laptop computer, a tablet computer, a server device, a client device, a mobile telephone, a personal digital assistant (PDA), a mobile audio or video player, a game console, a vehicle-mounted computer, or a Global Positioning System (GPS), or the like. Computer system 1000 may also be connected to other devices that are not illustrated, or may operate as a stand-alone system. In addition, the functionality provided by the illustrated components may in some embodiments be combined in fewer components or distributed in additional components. Similarly, in some embodiments, the functionality of some of the illustrated components may not be provided or other additional functionality may be available.

Those skilled in the art will also appreciate that while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1000 may be transmitted to computer system 1000 via transmission media or signals such as electrical, electromagnetic, or digital signals, conveyed via a communication medium such as a network or a wireless link. Various embodiments may further include receiving, sending, or storing instructions or data implemented in accordance with the foregoing description upon a computer-accessible medium. Accordingly, the present invention may be practiced with other computer system configurations.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims. Further modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, and certain features of the invention may be utilized independently, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an element" or "a element" includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequences, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The present techniques will be better understood with reference to the following enumerated embodiments:

1. A method, comprising: receiving, with a given rack computing unit, direct current (DC) power via a DC bus connected to a plurality of rack computing units of a rack and configured to deliver DC power to the plurality of rack computing units; determining that a duration of time designated for the given rack computing unit to access the DC power bus for transmission is occurring; in response to the determination, applying a time-varying electrical stimulus to the DC power bus, wherein the time-varying electrical stimulus encodes an address on the DC power bus of a rack controller and a sensor measurement indicative of operation of the given rack computing unit; and concurrent with applying the time-varying electrical stimulus, filtering voltage fluctuations of the DC power bus resulting from the time-varying electrical stimulus to produce electrical power used by the given rack computing unit.

2. The method of embodiment 1, wherein the time-varying electrical stimulus comprises varying a resistance to a lower voltage or a higher voltage than a voltage of the DC bus.

3. The method of any of embodiments 1-2, wherein the time-varying electrical stimulus comprises varying an impedance of the bus.

4. The method of any of embodiments 1-3, wherein the time-varying electrical stimulus comprises varying a current drawn from the bus or driven onto the bus.

5. The method of any of embodiments 1-4, wherein the DC power bus includes a generally straight conductive member extending along a side of the rack and having an exposed electrically conductive surface that delivers power to a contact on each rack computing unit.

6. The method of any of embodiments 1-5, comprising: determining that another rack computing unit on the DC power bus is transmitting concurrent with applying the time-varying electrical stimulus and, in response, selecting a different duration of time based on a random value.

7. The method of any of embodiments 1-6, comprising establishing a remote serial console session via the DC power bus to manage the given rack computing unit.

8. The method of any of embodiments 1-7, comprising encoding a data terminal ready signal in the time-varying electrical stimulus with pulse-width modulation.

9. The method of any of embodiments 1-8, comprising encoding a signal indicative of the physical location of the given rack computing unit in the rack in the time-varying electrical stimulus.

10. The method of any of embodiments 1-9, comprising: encoding an inventory of components of the given rack computing unit in the time-varying electrical stimulus; and executing an application in an operating system on a plurality of the rack computing units.

11. A system, comprising: a rack having a plurality of receptacles each configured to hold a rack computing unit; an in-band data network connected to the rack computing units; and out-of-band network separately connected to the rack computing units via a direct current (DC) power bus configured to power operation of the rack computing units, the out-of-band network comprising: a rack controller having a processor, a memory, and a powerline modem operative to send commands to, and receive data from, rack computing units of the rack via the DC power bus; a network and power adapter connecting each of the rack computing units to the DC power bus, the network and power adapter comprising: a powerline modem; and a microcontroller operative to execute commands sent by the rack controller even when an associated rack computing unit is turned off.

12. The system of embodiment 11, wherein the network and power adapter comprises: a low-pass filter operative to shield, at least in part, a respective rack computing unit from fluctuations in DC power on the DC power bus.

13. The system of any of embodiments 11-12, wherein the network and power adapter has memory storing instructions that when executed are operative to detect that two network and power adapters are transmitting concurrently and change a transmit time for the respective network and power adapter on the bus.

14. The system of any of embodiments 11-13, wherein a given network and power adapter is configured to maintain control of the DC power bus after receiving a message from the controller until the given network and power adapter transmits a response.

15. The system of any of embodiments 11-14, wherein the network and power adapters are configured to arbitrate access to the DC power bus with time division multiplexing.

16. The system of any of embodiments 11-15, wherein the DC power bus comprises: a conductive member extending along a plurality of the rack computing units, and wherein the rack computing units are slideable into and out of a respective receptacle in the rack, and wherein a power connector on respective rack computing units is configured and positioned to establish electrical contact to the conductive member as a result of the respective rack computing unit being slide into a respective receptacle.

17. The system of any of embodiments 11-16, wherein the rack control unit comprises an Ethernet out-of-band network interface, and wherein the rack controller is operative to communicate on an out-of-band Ethernet network shared by other racks.

18. The method of embodiment 17, wherein an address space of the DC power bus is distinct from the out-of-band Ethernet network.

19. The method of any of embodiments 11-18, comprising a respective inductor disposed in series between the powerline bus and each respective rack computing unit.

20. The method of any of embodiments 11-19, comprising: a rack computing unit disposed in each of the receptacles, each rack computing unit having memory storing instructions of an operating system and an application configured to exchange data over an in-band network connected to the respective rack computing unit.

What is claimed is:

1. A method, comprising:
receiving, with a given rack computing unit, direct current (DC) power via a DC bus connected to a plurality of rack computing units of a rack, wherein the DC bus is configured to deliver DC power to the plurality of rack computing units;
determining that a duration of time designated for the given rack computing unit to access the DC power bus for transmission is occurring;
in response to the determination, applying a time-varying electrical stimulus to the DC power bus, wherein the time-varying electrical stimulus encodes an address on the DC power bus of a rack controller and a sensor measurement indicative of operation of the given rack computing unit;
concurrent with applying the time-varying electrical stimulus, filtering voltage fluctuations of the DC power bus resulting from the time-varying electrical stimulus to produce electrical power used by the given rack computing unit, wherein the filtering is implemented with a low-pass filter that outputs the electrical power used by the given rack computing unit;
determining that another rack computing unit on the DC power bus is transmitting concurrent with applying the time-varying electrical stimulus or another time-varying electrical stimulus and, in response, selecting a different duration of time based on a random value;
encoding with pulse-width modulation the address on the DC power bus of the rack controller and the sensor measurement indicative of operation of the given rack computing unit in the time-varying electrical stimulus applied to the DC bus; and
controlling the plurality of rack computing units of the rack with the rack controller via multi-point connectivity on the DC bus by encoding RS-232 commands with pulse-width modulation of time-varying electrical stimulus applied to the DC bus, wherein the DC bus is distinct from an in-band network connected to the plurality of rack computing units.

2. The method of claim 1, wherein the time-varying electrical stimulus comprises varying a resistance of the DC bus.

3. The method of claim 1, wherein the time-varying electrical stimulus comprises varying an impedance of the bus.

4. The method of claim 1, wherein the time-varying electrical stimulus comprises varying a current drawn from the bus or driven onto the bus.

5. The method of claim 1, wherein the DC power bus includes a generally straight conductive member extending along a side of the rack and having an exposed electrically conductive surface that delivers power to a contact on each rack computing unit.

6. The method of claim 1, comprising establishing a remote serial console session via the DC power bus to manage the given rack computing unit.

7. The method of claim 1, comprising encoding a signal indicative of the physical location of the given rack computing unit in the rack in the time-varying electrical stimulus or another time-varying electrical stimulus applied to the DC bus.

8. The method of claim 1, comprising:
executing an application in respective instances of an operating system on the plurality of the rack computing units.

9. The method of claim 1, comprising:
communicating with the given rack computing unit via a first network that conveys data the given rack computing unit operates upon; and
communicating with the given rack computing unit via a second network by which the given rack computing unit is managed, wherein:
the first network is different from the second network, and
the second network includes the DC bus.

10. The method of claim 1, wherein:
the low-pass filter comprises an inductor in series between the DC bus and the given rack computing unit.

11. The method of claim 1, wherein:
the low-pass filter comprises a resistor in series between the DC bus and the given rack computing unit; and
the low-pass filter comprises a capacitor in parallel with the resistor.

12. The method of claim 1, wherein:
the low-pass filter comprises means for filtering.

13. The method of claim 1, comprising:
receiving a data terminal ready signal by comparing the pulse-width modulated encoding to an unmodulated signal of a same underlying frequency of the pulse-width modulated encoding; and
based on the comparing, detecting variations in edge timing of the pulse-width modulated encoding indicative of binary values.

14. The method of claim 1, comprising communicating, via the DC bus, signals encoded with pulse-width modulation, the signals comprising:
a data terminal ready signal, indicating that data terminal equipment is ready to receive, initiate, or continue communication via the DC bus;
a data set ready signal, indicating that data circuit-terminating equipment is ready to receive commands or data;
a request to send signal, indicating that data terminal equipment requests data circuit-terminating equipment to prepare to transmit data;
a request to receive signal, indicating that data terminal equipment is ready to receive data from data circuit-terminating equipment;
a transmitted data signal, carrying data from data terminal equipment to data circuit-terminating equipment; and
a received data signal, carrying data from data circuit-terminating equipment to data terminal equipment.

15. The method of claim 1, wherein:
controlling comprises updating or querying firmware versions.

16. The method of claim 1, wherein:
the address is part of an address space of the rack on the DC bus;
the address space is a different address space from that of DC busses on other racks.

17. The method of claim 1, comprising:
steps for encoding pulse-width modulation.

* * * * *